United States Patent [19]
Roberts

[11] 4,295,184
[45] Oct. 13, 1981

[54] CIRCUIT BOARD WITH SELF-LOCKING TERMINALS

[75] Inventor: Joseph A. Roberts, Hudson, N.H.

[73] Assignee: Advanced Circuit Technology, Nashua, N.H.

[21] Appl. No.: 137,449

[22] Filed: Apr. 4, 1980

Related U.S. Application Data

[60] Division of Ser. No. 934,702, Aug. 21, 1978, Pat. No. 4,223,435, which is a continuation-in-part of Ser. No. 808,808, Jun. 22, 1977, Pat. No. 4,107,836.

[51] Int. Cl.³ .............................................. H05K 1/18
[52] U.S. Cl. .................................. 361/406; 174/68.5; 361/403; 361/408
[58] Field of Search ............... 174/68.5; 361/406, 400, 361/403, 408

[56] References Cited

U.S. PATENT DOCUMENTS

| | | | |
|---|---|---|---|
| 2,869,040 | 1/1959 | Pifer | 361/406 X |
| 2,958,064 | 10/1960 | Swengel | 174/68.5 |
| 3,013,188 | 12/1961 | Kohler | 361/406 |
| 3,079,577 | 2/1963 | Brownfield | 361/406 X |
| 3,275,736 | 6/1966 | Hotine et al. | 174/68.5 |
| 3,528,173 | 9/1970 | Gall | 361/406 X |
| 3,670,409 | 6/1972 | Reimer | 361/406 X |
| 3,745,513 | 7/1973 | Gross | 361/406 X |
| 4,157,388 | 2/1980 | Roberts | 174/68.5 |

Primary Examiner—Richard R. Kucia
Attorney, Agent, or Firm—Strimbeck, Davis & Soloway

[57] ABSTRACT

The present invention provides an apertured circuit board having self-locking terminals which partially cover at least some of the apertures. The terminals, which are integral extensions of the circuit pathways, each include a pair of inwardly disposed generally L-shaped fingers. The terminals are adhesively anchored to the circuit board at the terminal peripheries and are covered in part by a dielectric overlay. The latter also provides environmental protection and electrical insulation to the circuit conductive pathways. The circuit board and integral sockets may be formed by photoimaging and chemical milling techniques.

11 Claims, 16 Drawing Figures

CIRCUIT BOARD WITH SELF-LOCKING TERMINALS

This application is a divisional of my copending application Ser. No. 934,702, filed Aug. 21, 1978 now U.S. Pat. No. 4,223,435 granted Sept. 23, 1980, for Circuit Board with Self-Locking Terminals, which in turn is a continuation in part of application Ser. No. 808,808, filed June 22, 1977 for Circuit Board with Self-Locking Terminals, now U.S. Pat. No. 4,107,836 granted Aug. 22, 1978.

This invention relates to electrical circuit assemblies and methods of manufacturing the same, and more particularly to improvements in circuit boards and to method for manufacturing the same.

In general, a printed circuit board comprises an electrically insulating base having an individual or composite electrical conductive pathways on at least one surface thereof, and one or more apertures communicating between opposite surfaces on the insulating base. At least some of the apertures are surrounded at least in part by extensions of the conductive pathways ("terminals") which provide connection points between the conductive pathways and electrical and electronic components. Numerous systems are well known in the art for mounting electrical and electronic components and connectors onto printed circuit boards. Typically, the components are provided with leads, in which case the components can be mounted to the board with their leads extending into and through the board apertures. Permanent electrical and mechanical connection between the components and the circuit board is achieved by soldering the components leads to the terminals surrounding the apertures. The component leads may be individually soldered to the board, e.g. as by hand soldering. However, connecting each lead in such manner is a tedious process. Accordingly, the art has developed various systems by which a plurality of soldered connections to a circuit board may be accomplished in a single mass soldering operation, e.g. employing pot soldering or wave soldering techniques.

Although soldered connections are considered to be highly effective to establish reliable electrical and physical connections between component leads and a circuit board, the soldering operation adds significantly to manufacturing costs. Furthermore, it generally is necesssary to clean soldered assemblies following soldering, and such cleaning also may add appreciably to manufacturing costs. Moreover, the relatively high temperatures typically required by mass soldering operations may damage heat sensitive components and/or may warp or delaminate the circuit board. Still another disadvantage of soldering is that replacing a faulty component is relatively time consuming and difficult, requiring both unsoldering and re-soldering operations. Moreover, such unsoldering and re-soldering operations may result in damage to the circuit board, adjacent components or other soldered connections on the board.

Solderless wrapping, crimping and socketing are known in the art and offer alternative methods to soldering for mechanically and electrically connecting electrical and electronic components onto printed circuit boards. Such methods rely on metal deformation of the jumper wire, the component lead or socket elements, or both, to form a metallurgically sealed electrical interface. Typically such methods require special equipment, are generally labor intensive, and also may have certain connection spacing requirements which limits their application in the case of high density configurations. Moreover, the stability of inter-connections formed by such methods depends in part upon the residual elastic stress remaining in the deformed metal, and thus may fail in the field due to stress relaxation. An additional requirement of such methods is to provide sufficient degree of metal deformation to break-down any surface oxides and other surface contaiminations that may be present on the mating metallic members, i.e. so as to assure a true metal-to-metal contact. As a practical matter a common practice in the art is to plate the mating members prior to assembly with a non-corrosive metal such as gold. Such plating requirements may add significantly to manufacturing costs. Moreover, while such prior art solderless interconnections theoretically offer an advantage over soldered connections of easy separability, in practice solderless interconnections may be subject to degradation due to metal loss from one or both contacting members upon repeated mating and unmating interconnections. Thus, such prior art solderless interconnections potentially offer advantages over soldered interconnections only in certain applications.

Still other methods of forming interconnections between printed circuit boards and electrical components are described in Swengel U.S. Pat. No. 2,958,064 and Hotine et al U.S. Pat. No. 3,275,736.

Swengel proposes forming a laminated circuit board with integral sockets for gripping electrical component leads or the like. According to Swengel, one or more layers or sheets of a resilient and rubbery-type material are bonded to a circuit board. The resilient sheets include apertures corresponding in location to the circuit board apertures. The apertures in the resilient sheets are of a diameter slightly less than that of the lead to be inserted therein, whereby the resilient sheets may mechanically grip a lead loaded in its apertures. In order to assure electrical continuity a circuit extension, preferably integral with the circuit pathways, is provided projecting into the aperture. An obvious disadvantage of the Swengel circuit board is the need for resilient sheets which may add to the cost of manufacture and may also substantially increase the weight of the board. Moreover, Swengel's resilient sheets prevent visual inspection of the circuit, e.g. to detect defects. Still another disadvantage of Swengel is the reliance on the mechanical force of deformation of rubbery-type materials to lock the component and board together. As is well known in the art such forces may lessen in time due to physical effects such as creep or stress relaxation and thus result in circuit failure in the field.

Hotine et al disclose an electrical connecting unit which basically comprises an apertured circuit board having a plurality of relatively thin finger-like spring members disposed so as to extend partly over the board apertures. The finger-like members have pointed ends, and are configured so as to define an aperture with respect to one another which aperture is slightly smaller in dimension than the cross-section of the component leads to be inserted therein. According to Hotine et al the finger-like members mechanically lock the component leads to the board; however, the required electrical connections to the circuit pathways are made by spot welding the individual finger-like members to the leads. Hotine et al reports that such redundant multiple welds result in improved reliability of the interconnections in the field. Obviously, the Hotine et al system is relatively costly. Moreover, the Hotine et al system is not believed to be practical in the case of high density applications due to the connection geometry, and the requirement for sufficient tie down area for adhesive or mechanical attachment of the individual finger-like members to the board. Moreover, substantial connector spacing is required to permit access to the individual finger-like members for welding.

It is thus a principal object of the present invention to provide a novel interconnection system for electrically and mechanically attaching electrical and electronic components to a printed circuit board. Another object of the invention is to provide a solderless interconnection system which overcomes the aforesaid problems of the prior art. Yet other objects of the present invention are to provide novel printed circuit boards having integral solderless self-locking terminals for mating with component leads, socket elements, jumper wires, and the like and to methods of producing circuit boards of the type above described.

In my co-pending application Ser. No. 808,808 I disclose an apertured circuit board having self-locking terminals partially covering at least some of the apertures. According to my aforesaid application Ser. No. 808,808, the terminals, which include spring member integral extensions of the circuit pathways, are adhesively anchored to the circuit board at the terminal peripheries and by a dielectric overlay. The latter is also said to provide environmental protection and electrical insulation to the circuit conductive pathways. A particular feature and advantage of the invention of my aforesaid application Ser. No. 808,808 is said to reside in an unique tie-down shoulder on each terminal which increases substantially the anchoring force provided by the dielectric overlay. Apertured circuit boards with self-locking terminals in accordance with my aforesaid application Ser. No. 808,808 may be formed by photo-imaging and chemical milling techniques.

While apertured circuit boards having self-locking terminals made in accordance with the teachings of my aforesaid application Ser. No. 808,808 provide a substantial improvement over solderless interconnection systems such as wire wrapping, crimping and socketing, and in particular laminated circuit boards with integral sockets made in accordance with the teachings of Swengel U.S. Pat. No. 2,958,064, supra, and the spring finger locking members of Hotine et al U.S. Pat. No. 3,275,736, supra, manufacturing tolerances must be relatively closely controlled to predetermined dimensions. For example, if the terminal pad spring members are too long, i.e. the spring members extend too far across the board apertures, loading of component leads, etc., into the terminal pads may be somewhat difficult. Also, too long terminal pad spring members may render difficult the removal of component leads. On the other hand, too short terminal pad spring members may produce inadequate electrical and mechanical connections. Manufacturing tolerances in accordance with the teachings of my aforesaid application Ser. No. 808,808 also must be adhered to in order to prevent adhesive flow onto the terminal pad spring members. Moreover, apertured circuit boards having self-locking terminals made in accordance with the prior art generally cannot mate with blade-type contacts, or with round leads of diameter less than about 0.030 inches.

Generally, the present invention involves an apertured circuit board having self-locking terminals which are integral extensions of the circuit pathways. The terminals include a pair of dissimilar sized L-shaped spring fingers. The L-shaped fingers are disposed, free ends facing one another, to overlay an associated aperture. The free ends of the spring fingers are spaced from the circuit board, while the ends opposite the free ends are adhesively anchored to the circuit board adjacent the terminal peripheries, and are tied-down by a dielectric overlay. The latter also provides environmental protection and electrical insulation to the circuit conductive pathways. A tie-down shoulder on each terminal increases substantially the anchoring force provided by the dielectric overlay. The circuit board and the integral sockets may be formed by photo-imaging and chemical milling (etching) techniques as will be described in detail following.

As used herein the term "printed circuit board" is intended to refer to circuit boards formed by conventional photo-imaging and etching techniques as well as by stenciling and the like. The particular circuit design is a matter of choice and will be determined by desired electrical and electronic considerations well known to the art and which form no part per se of the instant invention. The terms "electrical and electronic components" are intended to refer to both active and passive electronic components, lead and jumper wires, socket elements and the like.

For a further understanding of the nature and objects of the present invention, reference should be had to the following detailed description taken in connection with the accompanying drawings wherein like numbers depict like parts and:

Figure 1:
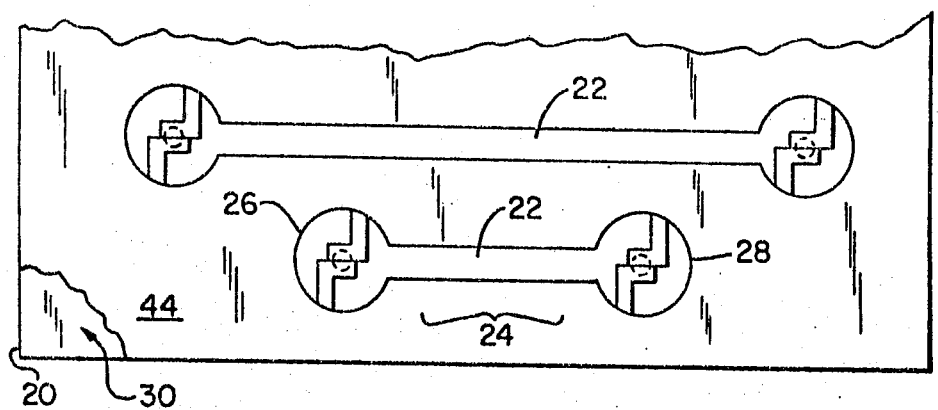
FIG. 1 is a top plan view of one form of circuit board constructed in accordance with the present invention.
Figure 2:
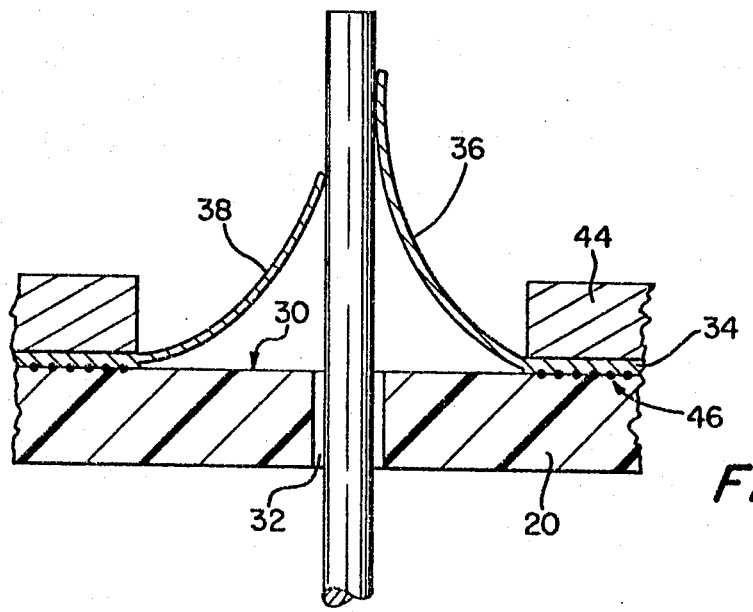
FIG. 2 is a side elevational view, partly in section of the circuit board of FIG. 1, and showing an exemplary connection to an electrical lead.
Figure 3:
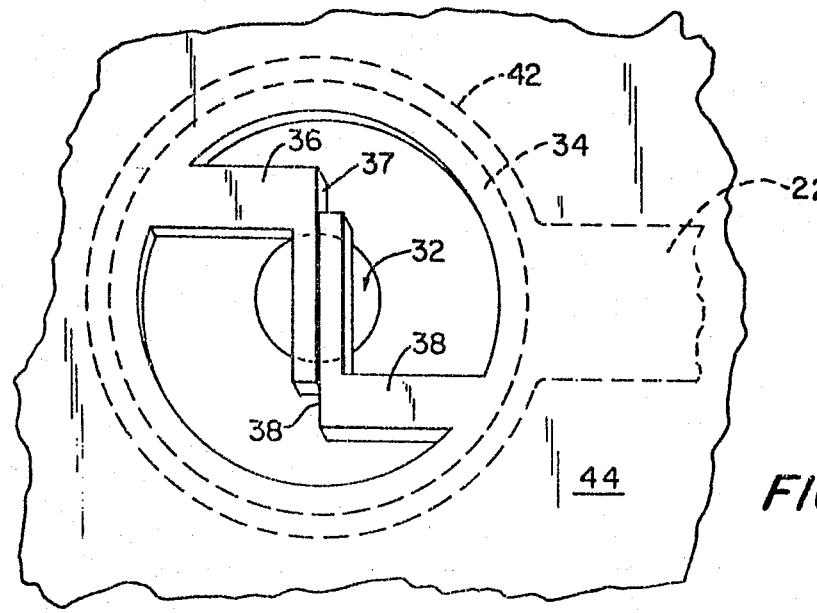
FIG. 3 is an enlarged top plan view, showing a single terminal and associated aperture of the circuit board of FIG. 1.

One embodiment of circuit board with self-locking terminals in accordance with the present invention is shown in FIGS. 1–3 of the drawings. In the embodiment of FIGS. 1–3 the circuit board comprises a rigid dielectric panel or base sheet 20 of conventional circuit board insulating material, e.g. 0.062 inch thick phenolic resin board. (For convenience of illustration only a portion of the circuit board is shown in the drawings). A plurality of electrically conductive circuit pathways 22, each comprising an elongate central portion 24 extending between terminal pad ends 26 and 28, respectively, are provided on at least one surface, e.g. surface 30 of panel 20. For convenience of illustration, circuit pathways 22 are illustrated as being provided on only one surface 30 of panel 20. It will be understood however, that circuit pathways 22 may be provided on the panel 20 opposite surfaces. Alternatively, panel 20 may comprise a plurality of insulating panels and may include one or more internally carried layers of circuit pathways. The conductive pathways have dimensions and shapes corresponding to desired design criteria, e.g. current carrying capacity and circuit geometry. One or more apertures 32 are formed through panel 20 communicating betwen opposite surfaces on the panel.

Figure 13:
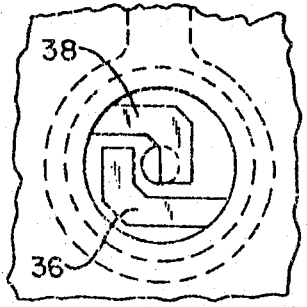

As seen in the drawings terminal pads 26 and 28 are integral extensions of central portions 24. Pads 26 and 28 are larger in plan than apertures 32, and the pads partially cover the apertures 32 at least in part. Apertures 32 typically are round holes. As will become clear from the description following the diameter of apertures 32 will depend in part on the diameter of the lead to be loaded therein. For example, for a typical lead of about 0.030 inch diameter aperture 32 should have a diameter of about 0.010 to 0.030 inches. Referring particularly to FIGS. 1 to 3 each terminal pad (e.g. pad 26) includes a generally circular frame member 34 and inwardly disposed spring fingers 36 and 38. As seen in FIG. 3 spring fingers 36 and 38 each constitute an L-shaped member and are formed (deflected) upwardly from panel 30 (see FIG. 2). One of the spring fingers (e.g. finger 36) is somewhat longer than the other finger 38, however, the longer finger 36 is deflected further upwardly than the shorter finger 38 so that the far edges 37 and 39 of fingers 36 and 38, respectively, essentially lie on a line which dissects aperture 32. Spring fingers 36 and 38 are formed integrally with frame member 34; the latter in turn is formed integrally with an associated circuit pathway 22. An important feature and requirement of the present invention is to make the two spring fingers of different size, i.e. one spring finger 36 should be longer than the other spring finger 38 so that in undeflected state (see FIG. 13) the longer finger 36 would thus extend further across aperture 32. Also, spring fingers 36 and 38 should be shaped and dimensioned so that when undeflected the facing edges of the spring fingers define a generally rectangular interspace of approximately 0.030 inches by 0.020 inches. Forming spring fingers 36 and 38 of different size as shown in FIG. 13, and deflecting the fingers upwardly from panel 20 as shown in FIG. 2 facilitates loading and unloading component leads, etc. in the board as will become clear from the description following.

As mentioned above terminal pads 26 should be substantially larger in overall plan than apertures 32, and the pads should be "centered" over the apertures. Another feature and requirement of the present invention is to space spring fingers 36 and 38 from the surface 30 of panel 20. This latter feature and requirement is achieved by making the spring fingers 36 and 38 thinner in cross-section than frame member 34 by a manufacturing process as will be described in detail hereinafter. By way of example but not limitation, assuming frame member 34 has a thickness of about 0.010 inch, spring fingers 36 and 38 may be spaced about 0.001 to 0.009 inches from surface 30 and may have a thickness of about 0.009 to 0.001 inches. Making the spring fingers 36 and 38 thinner than their supporting frame member 34, and spacing the spring fingers from the board surface 30 increases flexibility of the fingers, and reduces the possibility of adhesive flow onto the spring fingers during manufacture as will be described in detail hereinafter.

As in the case of the circuit board described in my aforesaid application Ser. No. 808,808 terminal pads 26 and 28 are called upon to perform the four-fold functions of (1) electrically connecting the conductor central pathways 24 and the component leads or wires, (2) mechanically hold and maintain the wires or components leads, to the board, (3) permit assembly of wires or leads by simple mechanical deflection, and (4) apply relatively high pressure against the wires or leads throughout the design life of the assembly.

A deficiency of prior art self-locking terminal boards, e.g. as taught by Swengel is the failure to provide sufficient mating or hold-down area between the circuit terminals and the substrate board for adequately adhesively anchoring the terminals to the board. Sufficient hold-down area is required to prevent the terminals for delaminating from the board during lead insertion or removal and also to ensure a constant operating force. As will be appreciated providing sufficient hold-down area between the terminals and the surrounding board may present a particularly acute problem in the case of high density applications. In my aforesaid copending application Ser. No. 808,808 I describe a solution to the problem of terminal pad hold-down by providing the terminal pads with outwardly depending integral shoulders or steps of reduced thickness relative to the main body of the terminal. The shoulders can then be captured under a dielectric overlay, and thereby anchored to the board. The present invention incorporates a similar solution to the hold-down problem by providing outwardly depending integral shoulders or steps 42 of reduced thickness on the peripheries of the terminal pads 26 and 28. For example, assuming a terminal pad of thickness of about 0.010 inches measured at main frame member 34, shoulders 42 may have a thickness in the range of about 0.001 to 0.005 inches, preferably about 0.003 inches. Providing outwardly depending shoulders on the terminal pads provides a capture area for adhesive coated dielectric overlay 44. Thus, as seen in FIG. 2 the terminal ends, e.g. the flat bottom surface of terminal pad 26 and its associated conductor pathway 24 are bonded to the top surface 30 of rigid panel 20 by an adhesive 46. Overlay 44 is also bonded to the top surface of panel 20, and the top surface of the conductor pathways 22. Overlay 44 also extends over terminal shoulders 42 whereby to capture and cover the shoulders 42 at least in part. As seen in FIGS. 1 and 2 overlay 44 preferably extends to the main, e.g. full thickness areas of terminal pad frame members 34. Overlay 44 may be formed of an electrically insulating polymeric film material such as a polyester, polypropylene, polyimide, cellulose triacetate, polyethylene terephthalate or other commercially available film, e.g. as in accordance with my aforesaid copending application Ser. No. 808,808; preferably however, overlay 44 comprises a rigid dielectric sheet or board such as phenolic board which may be the same or different thickness as the base sheet 20. Overlay 44 bonded to the circuit rigid panel 20, terminal pads 26 and 38, shoulder areas 42 and the conductor pathways 22 by suitable adhesive means such as a modified epoxy, or acrylic based adhesive.

FIGS. 4–14 illustrate one method of forming a circuit board having integral self-locking terminals in accordance with the present invention.

An electrically conductive, resiliently flexible metallic sheet 50 preferably of a thickness substantially equal to that desired for the full thickness areas of terminal pads 26 and 28, i.e. frame members 34 is provided. In the illustrated case metallic sheet 50 comprises 0.010 inch thick phosphor bronze ST. One skilled in the art will recognize however that other electrically conductive, resiliently flexible metallic materials may be employed. The top and bottom surfaces 52 and 54 of the metallic sheet 50 are then cleaned employing conventional techniques, and cleansed surfaces are then coated at a coating station 56 (FIG. 4) with conventional acid resist materials layers 58 and 60, respectively. Then one side of metallic sheet 50 (e.g. top side 52 and resist layer 58) is exposed to light, at an imaging station 62 to a negative art work image of the terminal pads frame members 34 and spring fingers 36 and 38. Simultaneously bottom resist layer 60 is exposed to light, at imaging station 62, to a positive art work image of the terminal area bonded by frame members 34. Those areas of resist coatings 58 and 60 exposed to light are altered to a lower molecular weight polymer. The sheet is then immersed in a preferential solvent and developed at a treating station 64, with the result that the exposed portions of resist layers 58 and 60 remain intact while the unexposed areas are dissolved leaving resist layer 58 in a positive image of terminal pads 26 and 28, frame members 34 and spring fingers 36 and 38, and leaving resist layer 60 in a negative image of the area bounded by frame members 34.

Figure 6:
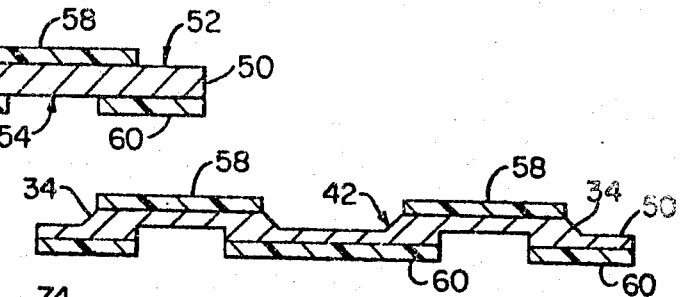

The next step involves chemically milling the exposed metallic areas of metallic sheet 50 by contacting the sheet 50 with an acid etching solution at an etching station 68. Etching is controlled to remove metal from the unprotected terminal pad underside areas to a depth to leave metal of thickness which substantially equals that desired for the spring fingers 34 and 36. For example, if 0.003 inch thick spring fingers are desired, etching should be controlled to a depth of about 0.007 inches. Obviously, the other unprotected areas of sheet 50 will also be etched to a similar depth in the etching station 68 with the result that the sheet 50 will also be thinned to partly define the terminal pad shoulders 42 as shown in FIG. 6.

Thereafter, the etched sheet is treated in a stripping station 70 wherein the acid resist remaining on the sheet is removed from both sides of the sheet. A metallic sheet having a contoured surface 72 with raised areas 74 and back-etched spring fingers 36 and 38 as shown in FIG. 7 results.

Figure 7:
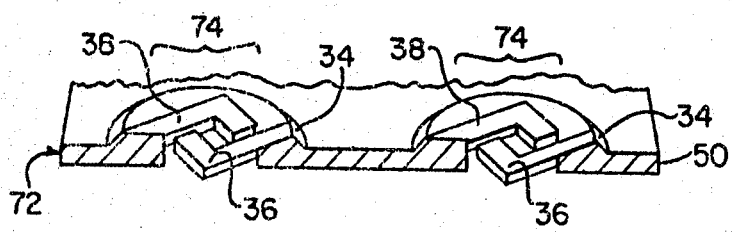

The next step in the process of the present invention is to partially cover all but the terminal pad areas of the FIG. 7 sheet 50 with a dielectric overlay in the form of a rigid electrically insulating stiffening board such as 0.062 inch thick phenolic resin board 44. Board 44 should be pre-drilled so as to cover substantially the entire surface 52 of metallic sheet 50 other than the terminal pad areas. Board 44 is applied to sheet 50 at a mounting and laminating station 78 (FIG. 4), and the board is laminated to the metallic sheet by means of a suitable adhesive, for example a B-stage thermoplastic adhesive such as one of the many modified acrylic adhesives as are commercially available. As will become clear from the description following dielectric overlay 44 performs the two-fold functions of (1) mechanically anchoring the terminals to the substrate panel and (2) electrically insulating the circuit pathways. A phenolic board/contoured metallic sheet laminate as shown in FIG. 8 results.

Figure 8:
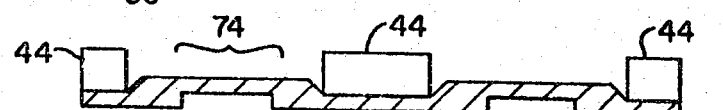
Figure 9:
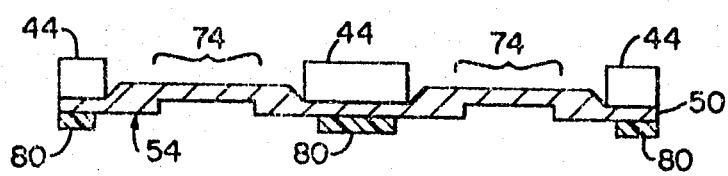

The FIG. 8 phenolic board/metallic sheet laminate is then returned to coating station 56 where the uncovered surface 54 of sheet 50 is coated with layer 80 of a conventional resist material. Then using one or more of the raised areas 74 to insure front-to-back image registration, resist layer 80 is exposed to a negative art work pattern which essentially defines the areas subtended by apertured frame members 34 at imaging station 62. The sheet is then treated in treating station 62 with the result that exposed areas of the resist layer 80 remain intact while the unexposed areas are dissolved away as before. The resulting structure appears substantially as shown in FIG. 9. It should be noted that at this stage in the process metallic sheet 50, while contoured and apertured, still is continuous.

The next step involves plating the exposed metallic areas of sheet 50 by a conventional plating technique, e.g. by electrodeposition, in known manner, of a precious or semi-precious material such as gold plate 81 at a plating station 82. Inasmuch as the metallic sheet 50 is still continuous at this stage of the processing, assuring electrical continuity for plating purposes to each terminal end is assured. Overlay board 44 effectively masks the entire top surface 52 of sheet 50 other than the terminal pad areas, while resist layer 80 effectively masks the entire bottom surface 54 of sheet 50 except areas subtended by the terminal pad frame members 34. As a result deposition of the precious metal is restricted essentially to those areas of sheet 50 which ultimately will become parts of the terminal pads and the spring fingers. One skilled in the art will recognize an advantage of the present invention in that plating the terminals thus is an especially simple procedure, and which may result in a relatively low consumption of precious metal. Still another advantage of the invention is that the actual contact edges of the spring fingers 34 and 36 are also plated.

Figure 10:
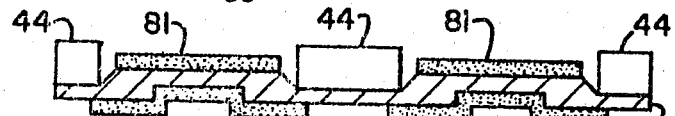

Following plating the resist layer 80 is then stripped from surface 54 at stripping station 70. The resulting structure appears substantially as shown in FIG. 10. Thereafter, using the plated areas as a resist, the metallic structure is returned to etching station 68 to complete the definition of the terminal pad frame members 34 and to define the conductors 22.

Figure 11:
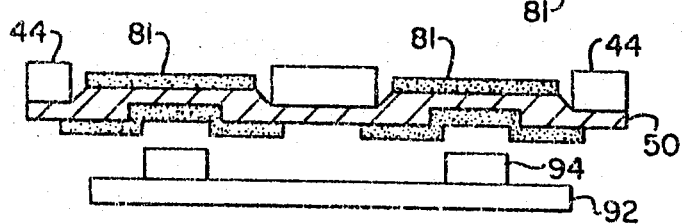
Figure 12:
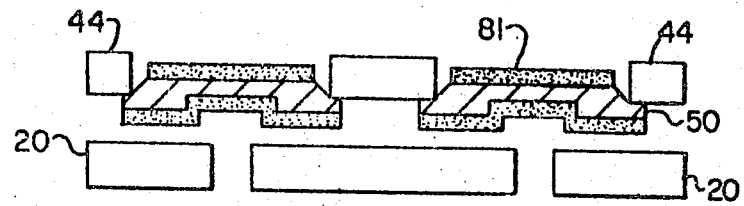

At this point, the resulting metal/phenolic board structure is passed to a forming station 90 where the spring fingers 36 and 38 are permanently reflected upwardly, i.e. away from the bottom surface 54 of sheet 50 into their respective apertures in overlay board 44. As seen in FIG. 11 forming station 90 includes a die block 92 having a plurality of forming pins 94 which are suitably sized and positioned to mate with the apertures in the overlay board 44. Deflection occurs in two steps with the forming pins 94 initially contacting and deflecting at least in part the shorter spring fingers 38 (see FIG. 13). Then the longer spring fingers 36 are contacted by the forming pins 94, and deflected upwardly past the at least partially deflected shorter spring fingers 36. The resulting structure appears as shown in FIG. 14.

Figure 15:
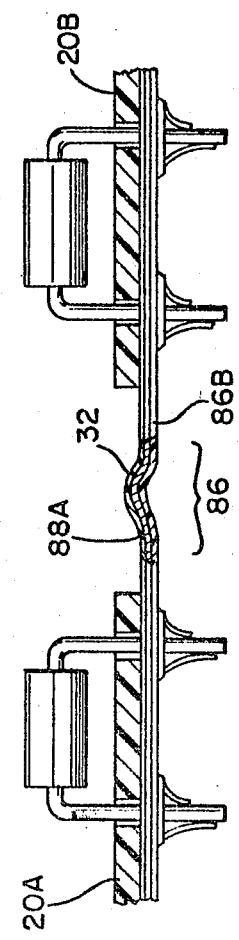
FIG. 15 is a side elevational view, partly in section, showing an alternative construction of circuit board made in accordance with the instant invention.
Figure 5:
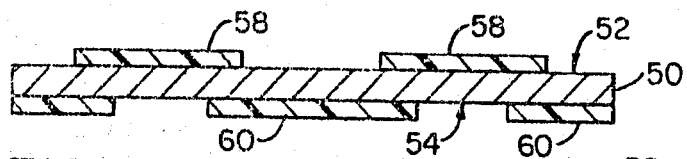
FIGS. 5–14 are side elevational views of a circuit board at various stages of formation in accordance with the process of FIG. 4.
Figure 14:
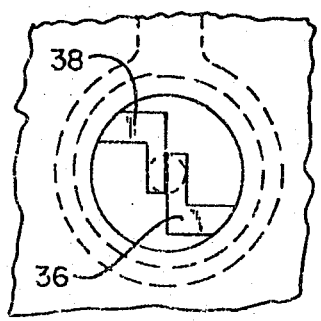

The final step involves mounting the FIG. 14 structure at mounting and laminating station 78 onto a rigid panel or sheet 20 such as a 0.062 mil phenolic resin board. The latter is predrilled with a plurality of apertures 32. As seen in FIGS. 2 and 15 apertures 32 are located in panel 20 to be concentric with circular frame members 34 when the panel 20 is mounted onto the FIG. 14 structure. The metal/film structure is then laminated to the rigid panel 20 in known manner, e.g. employing a thermosetting adhesive, heat and pressure. An advantage of the present invention which becomes particularly evident at this step is that as a result of the earlier etch processing the spring fingers are deflected and raised above the surface of panel 20. Thus, the likelihood of adhesive flow under the spring members 36 and 38 during lamination to the rigid panel 20 is relatively remote. The resulting structure is a printed circuit board of the type shown in FIGS. 1–3.

One skilled in the art will recognize that the mechanical locking force of the terminal pad spring fingers 36 and 38 can be varied to meet specific design requirements, for example by employing a metallic substrate material of desired spring characteristics and thickness, by adjusting the size and/or shape of the spring fingers 36 and 38, or by a combination of one or more of the foregoing. For example, if a relatively large spring force is desired, the metallic substrate starting material (sheet 50) may be spring steel. In such case it may be desired to plate-up the terminal contact areas (station 82) with a preferred electrically conductive material such as copper, or copper plate followed by tin plate. Processing is otherwise as before. An advantage of the present invention which results from making spring fingers 36 and 38 of different relative size and of pre-forming the fingers is seen in FIG. 2, in which there is shown a component lead 84 loaded in a terminal pad made in accordance with the invention. It should be evident to one skilled in the art that because the spring fingers 36 and 38 are L-shaped of different length relatively wide variations in finger dimensions can be toleranced. Moreover, since the spring fingers are pre-formed, component or wire lead insertion and/or removal is also facilitated.

Figure 16:
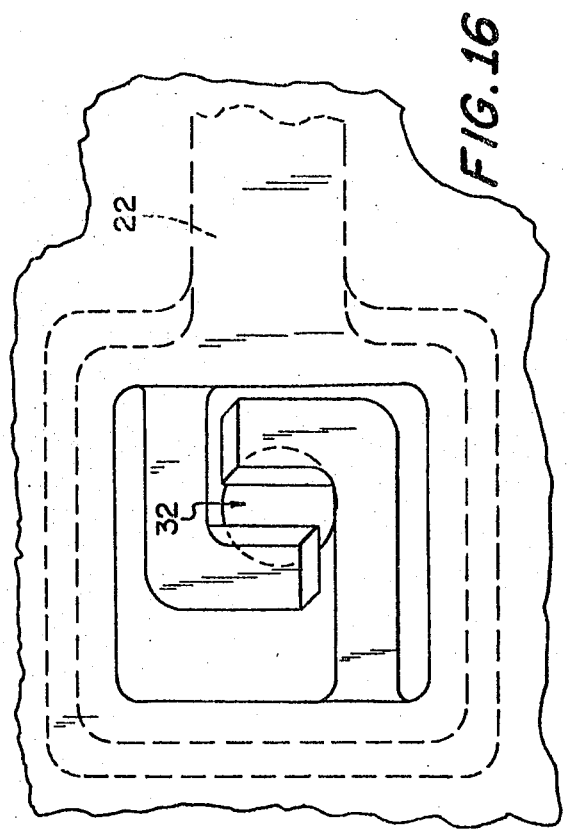
FIG. 16 is an enlarged top plan view, showing an alternate form of terminal and associated apertured circuit board made in accordance with the instant invention.
Figure 4:
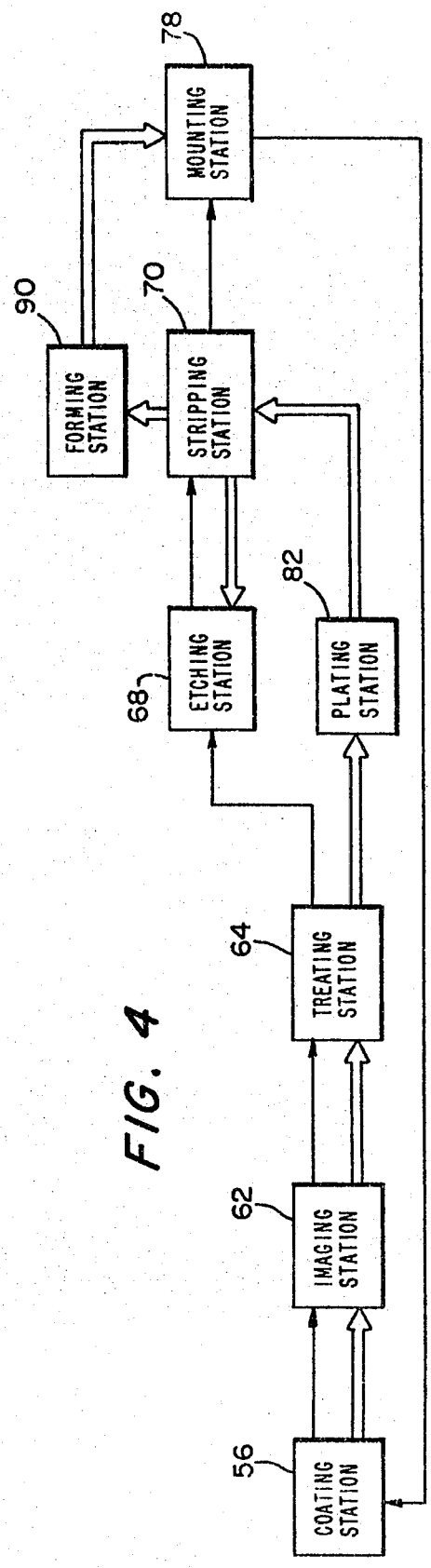
FIG. 4 is a side elevational view, diagrammatically illustrating a process for producing the circuit board of FIG. 1.

Various changes may be made in the foregoing process and product without departing from the spirit and scope of the foregoing invention. For example, the process can be modified to provide a circuit board having flexible conductor pattern area 86, e.g. by providing rigid panels 20A, 20B adjacent and supporting only terminal pads 26 and 28 (FIG. 15), as in accordance with the teachings of my aforesaid copending application Ser. No. 808,808. Obviously, this will leave portions of the conductors 32 exposed. In such case conductors 32 can be covered, if desired, by thin, flexible dielectric overlay films 88A and 88B which may be adhesively secured to conductors 22, rigid panels 30A, 30B and the terminal pads. The foregoing process of the present invention may also be adopted to produce two-sided or multi-layer circuit boards. Moreover, the terminal pads may be formed in the shape of a square or rectangle as shown in FIG. 16 rather than as round pads as shown in FIG. 3. Still other changes will be obvious to one skilled in the art.

What is claimed is:

1. A circuit board comprising in combination:
   a rigid dielectric carrier panel, said carrier panel having at least one aperture formed between opposite surfaces thereof;
   at least one electrically conductive circuit formed of a resiliently flexible metal, secured at least in part to said dielectric carrier panel, said electrically conductive circuit having (i) at least one integral termination which essentially surrounds said at least one aperture in said panel, said termination including (ii) a pair of dissimilar size generally L-shaped fingers disposed inwardly for a distance from the edge of said aperture:
   said termination including a frame section of cross-sectional thickness greater than the cross-sectional thickness of said electrically conductive circuit and a shoulder section of reduced cross-section thickness as compared with said frame section, said shoulder section having a plan area greater than that of said at least one aperture, said shoulder being secured to said dielectric panel at least in part; and
   a dielectric material covering said conductive circuit patterns at least in part and secured to said dielectric panel, said dielectric material having (i) at least one aperture substantially corresponding in position to said at least one termination and (ii) overlaying and secured at least in part to said termination shoulder area.

2. A circuit board according to claim 1 wherein said resiliently flexible metal comprises a phosphor bronze.

3. A circuit board according to claim 1 wherein said spaced fingers and said conductive circuit are plated at least in part with an electrically conductive metal.

4. A circuit board according to claim 1 wherein said resiliently flexible metal comprises a spring steel.

5. A circuit board according to claim 1 wherein said dielectric material covering comprises a rigid dielectric panel.

6. A circuit board according to claim 1 wherein said dielectric material covering comprises a polymeric film material.

7. A circuit board according to claim 1 wherein the free ends of said generally L-shaped fingers are deformed away from said rigid carrier panel.

8. A circuit board according to claim 1 wherein said finger free ends have a cross-sectional thickness in the range of 0.009 to 0.005 inches and are spaced from said adjacent areas of said rigid carrier panel by 0.001 to 0.009 inches.

9. A circuit board according to claim 1, and further including at least one electrical or electronic component electrically and mechanically connected to said board with its lead(s) extending through and locked in said at least one termination.

10. A circuit board according to claim 1 and including circuit areas of relative flexibility.

11. A circuit board according to claim 10 and further including at least one electrical or electronic component electrically and mechanically connected to said board with its lead(s) extending through and locked in said at least one termination.

* * * * *